(12) United States Patent
Weber et al.

(10) Patent No.: US 11,214,042 B2
(45) Date of Patent: Jan. 4, 2022

(54) PANE ARRANGEMENT COMPRISING A COMPOSITE PANE HAVING AN EXTENDED CAPACITIVE SWITCHING REGION

(71) Applicant: SAINT-GOBAIN GLASS FRANCE, Courbevoie (FR)

(72) Inventors: Patrick Weber, Alsdorf (DE); Stefan Droste, Herzogenrath (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 210 days.

(21) Appl. No.: 16/347,052

(22) PCT Filed: Oct. 25, 2017

(86) PCT No.: PCT/EP2017/077228
§ 371 (c)(1),
(2) Date: May 2, 2019

(87) PCT Pub. No.: WO2018/082977
PCT Pub. Date: May 11, 2018

(65) Prior Publication Data
US 2020/0070478 A1 Mar. 5, 2020

(30) Foreign Application Priority Data
Nov. 4, 2016 (EP) .................... 16197265

(51) Int. Cl.
*B32B 3/10* (2006.01)
*B32B 17/10* (2006.01)

(52) U.S. Cl.
CPC .. *B32B 17/10036* (2013.01); *B32B 17/10495* (2013.01); *B32B 17/10183* (2013.01);
(Continued)

(58) Field of Classification Search
None
See application file for complete search history.

(56) References Cited

U.S. PATENT DOCUMENTS 6,452,514 B1 9/2002 Philipp
6,654,070 B1 11/2003 Rofe
(Continued)

FOREIGN PATENT DOCUMENTS

DE 20 2006 006 192 U1 7/2006
DE 20 2008 017 611 U1 4/2010
(Continued)

OTHER PUBLICATIONS

International Search Report as issued in Internaitonal Patent Application No. PCT/EP2017/077228, dated Jan. 22, 2018.

*Primary Examiner* — Christopher M Polley
(74) *Attorney, Agent, or Firm* — Pillsbury Winthrop Shaw Pittman LLP

(57) ABSTRACT

A pane arrangement includes a first and second pane joined by an intermediate layer, an electro-optical functional element including a first surface electrode, an electro-optical functional layer, and a second surface electrode, wherein the functional element is arranged between the first and second panes, and the first and second surface electrodes face, respectively, the first and second panes, a sensor electrode arranged between the first surface electrode and the first pane and the sensor electrode is capacitively coupled to the first surface electrode, and a capacitive electronic sensor system electrically connected to the sensor electrode. The sensitivity of the electronic sensor system is selected such that when the outer surface of the first pane is touched above the first surface electrode by a human body part or the human body part approaches the outer surface of the first pane above the first surface electrode, a switching signal is emitted.

20 Claims, 7 Drawing Sheets

(52) U.S. Cl.
CPC ... *B32B 2307/202* (2013.01); *B32B 2307/412* (2013.01); *B32B 2605/006* (2013.01); *B32B 2605/08* (2013.01)

(56) References Cited

U.S. PATENT DOCUMENTS

2006/0275599 A1   12/2006  Lefevre
2010/0179725 A1    7/2010  Boote et al.
2016/0313587 A1* 10/2016  Linthout .................. G01D 5/24

FOREIGN PATENT DOCUMENTS

| | | |
|---|---|---|
| EP | 0 899 882 A1 | 3/1999 |
| EP | 0 847 965 B1 | 10/2004 |
| EP | 1 515211 A1 | 3/2005 |
| EP | 2 139 049 A1 | 12/2009 |
| EP | 2 200 097 A1 | 6/2010 |
| JP | 2015-204098 A | 11/2015 |
| JP | 2016-504217 A | 2/2016 |
| JP | 2016-149114 A | 8/2016 |
| RU | 2158204 C1 | 10/2000 |
| WO | WO 2012/052315 A1 | 4/2012 |
| WO | WO 2015/086599 A1 | 6/2015 |
| WO | WO 2015/162108 A1 | 10/2015 |
| WO | WO 2016/116372 A1 | 7/2016 |

* cited by examiner

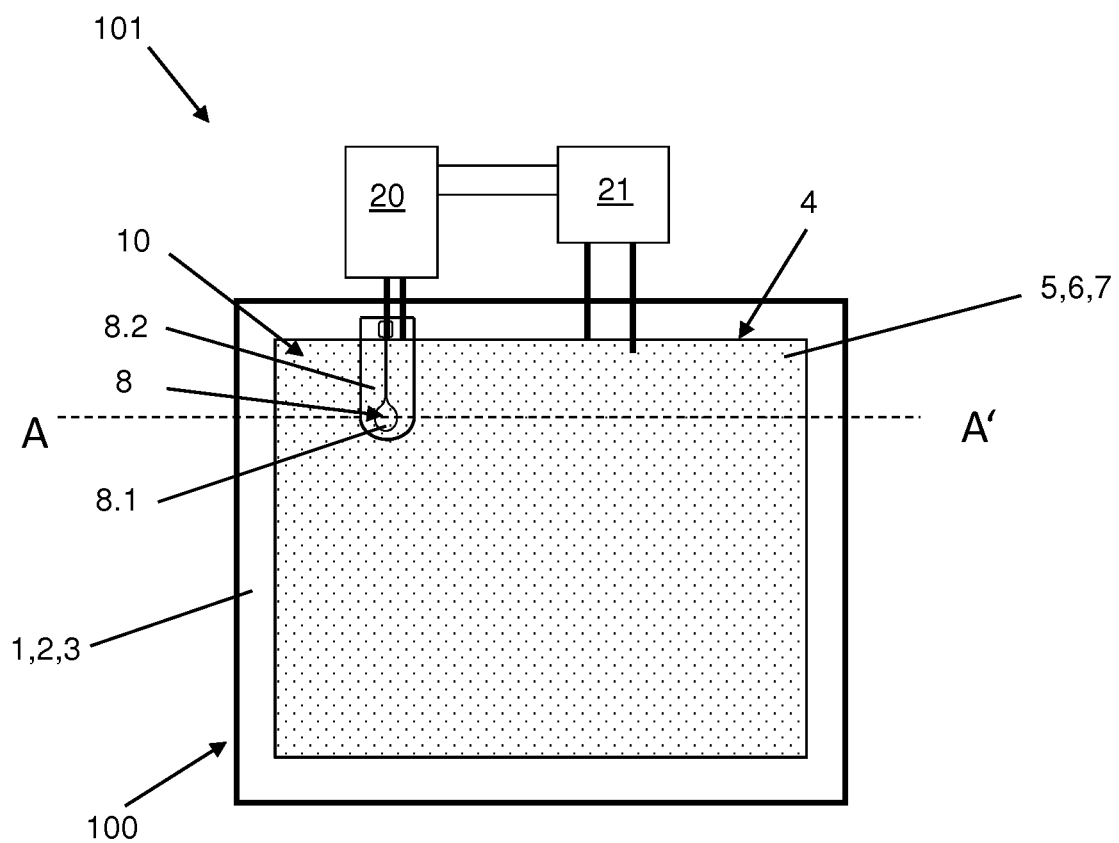
Figur 1A

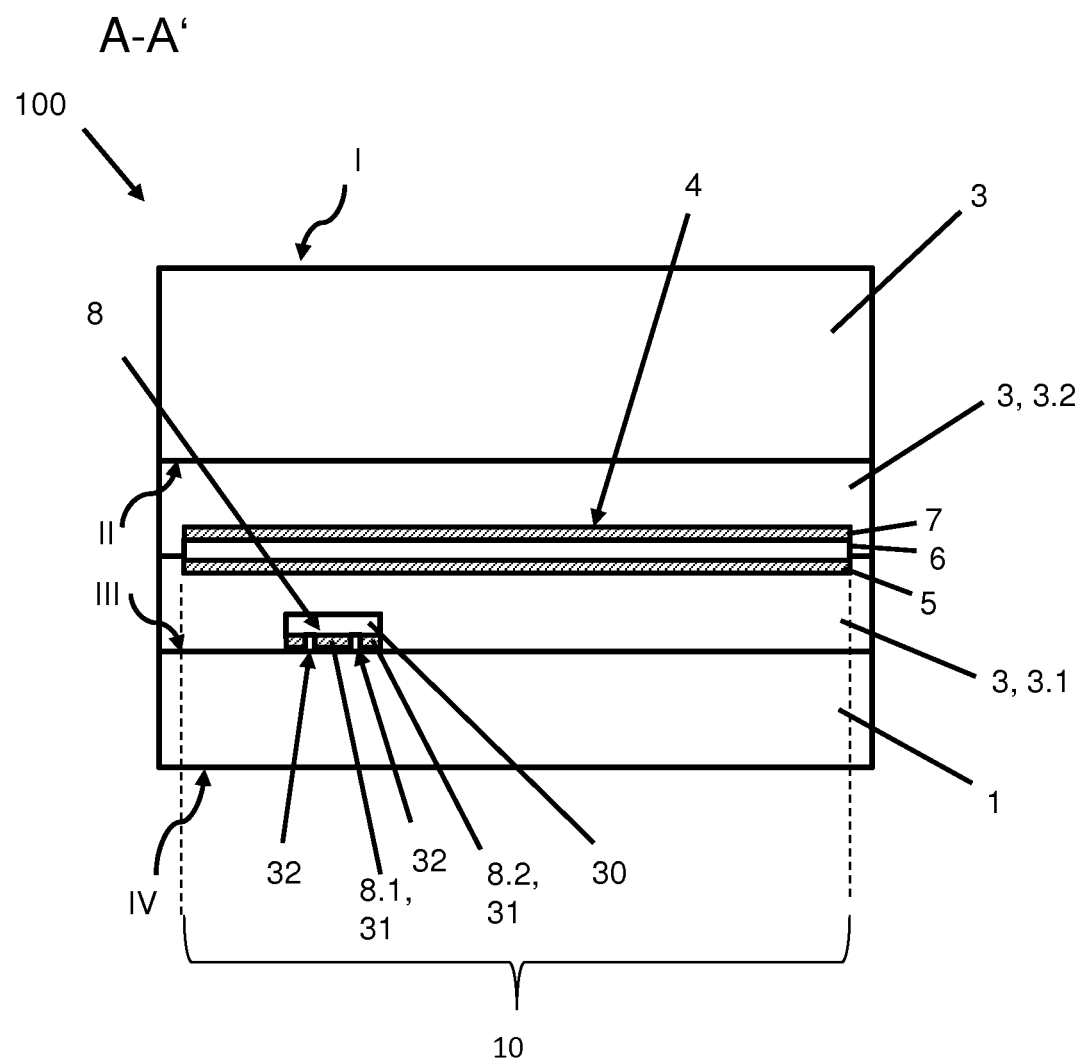
Figur 1B

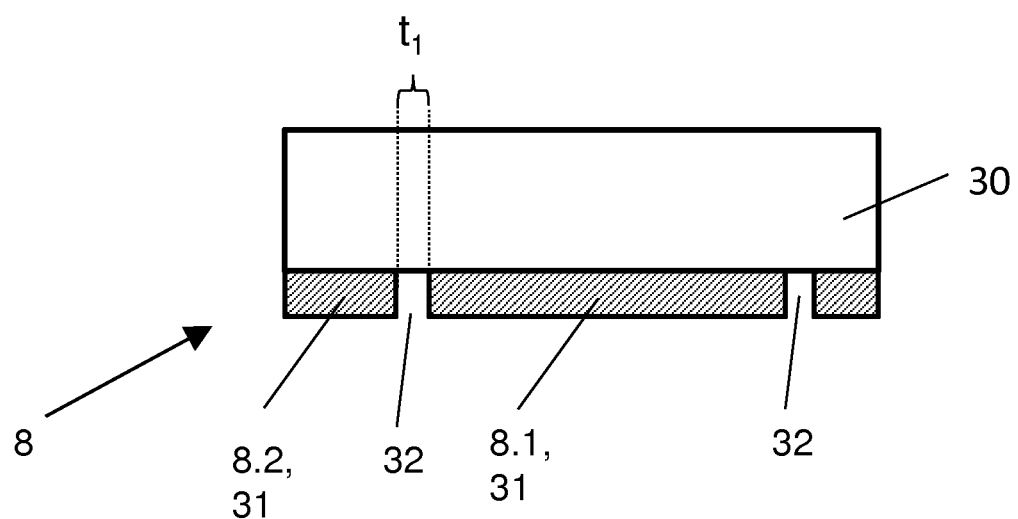
Figur 1C

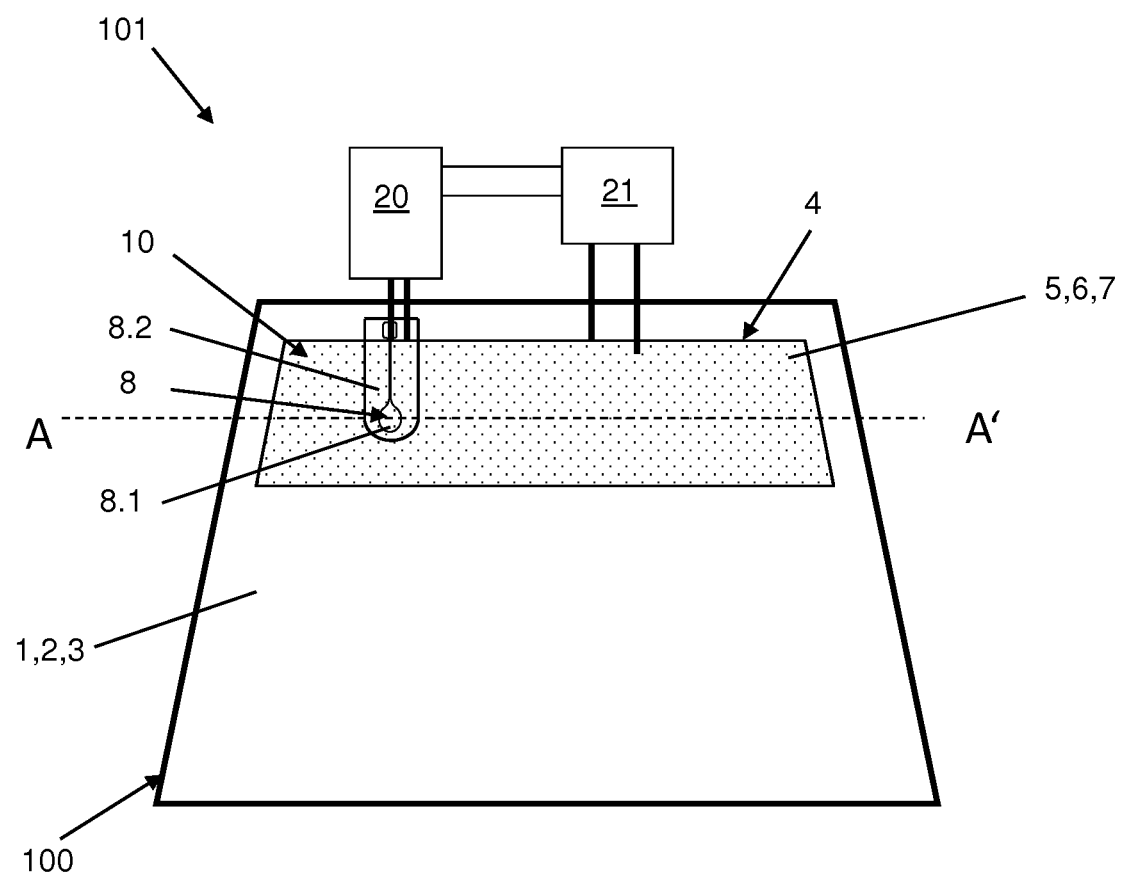
Figur 2

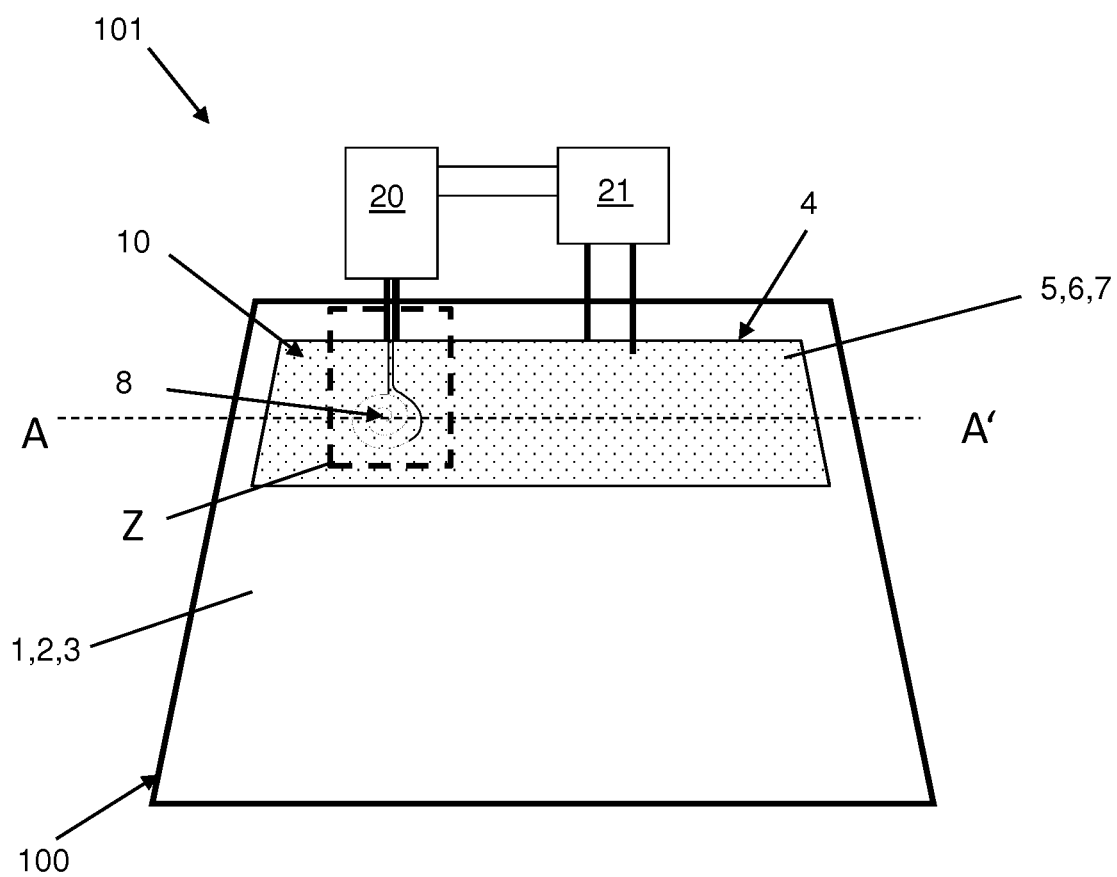
Figur 3A

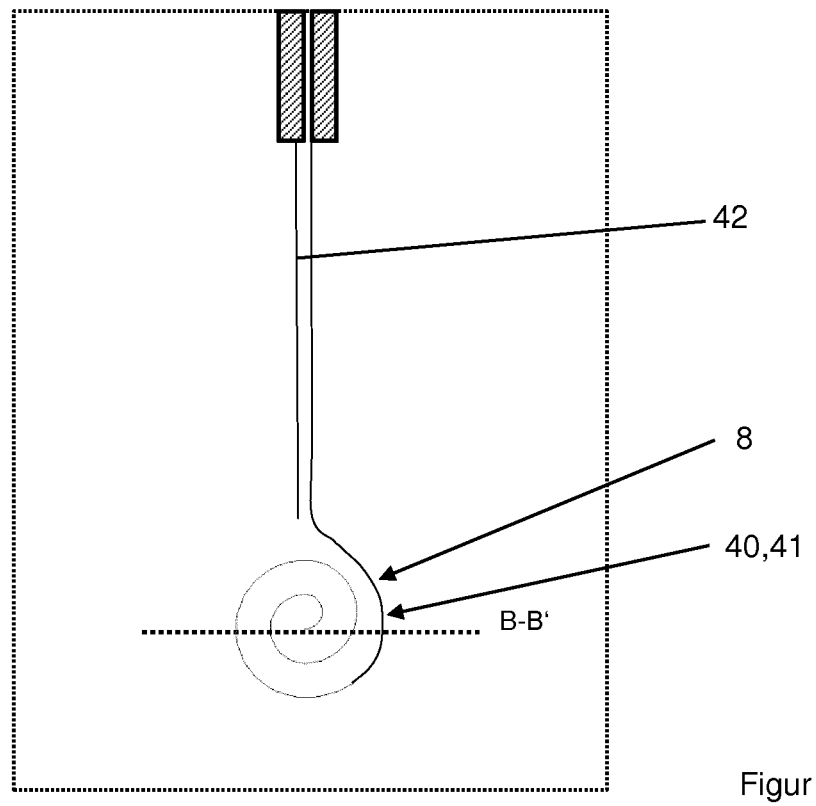
Figur 3B
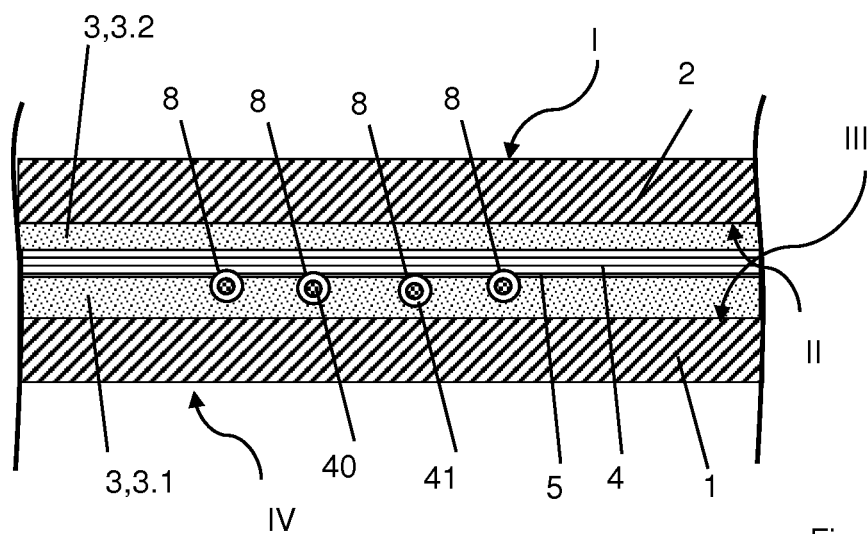
Figur 3C

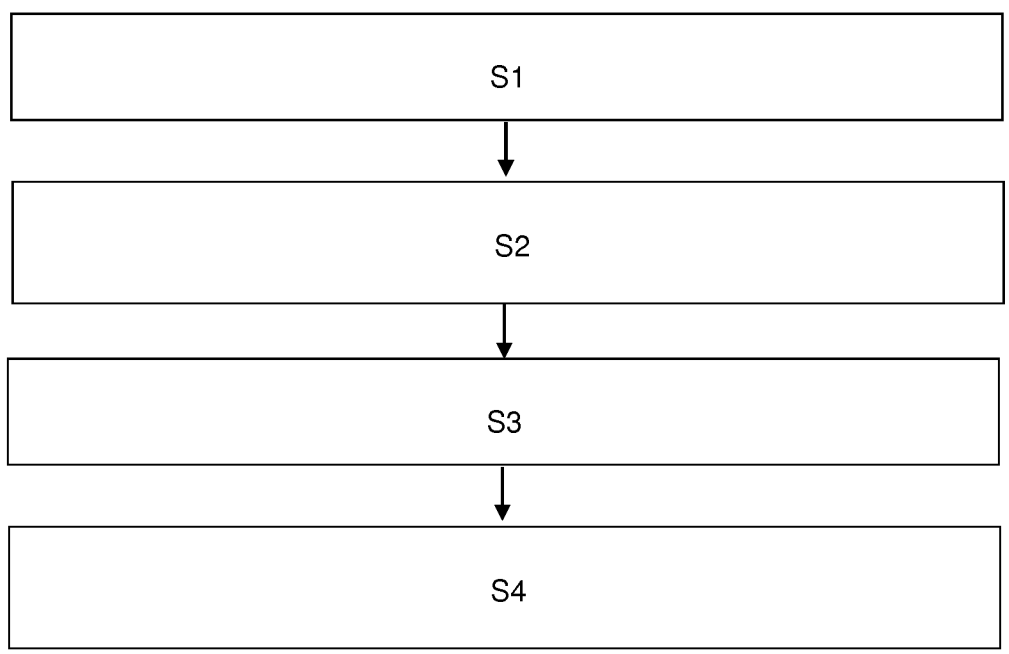
Figur 4

PANE ARRANGEMENT COMPRISING A COMPOSITE PANE HAVING AN EXTENDED CAPACITIVE SWITCHING REGION

CROSS-REFERENCE TO RELATED APPLICATIONS

This application is the U.S. National Stage of PCT/EP2017/077228, filed Oct. 25, 2017, which in turn claims priority to European patent application number 16197265.8, filed Nov. 4, 2016. The content of these applications are incorporated herein by reference in their entireties.

The invention relates to a pane arrangement comprising a composite pane having an extended capacitive switching region, a pane arrangement, a method for producing the composite pane, and use thereof.

It is known that capacitive switching regions can be implemented by a sensor electrode or by an arrangement of two coupled sensor electrode regions such as a first subregion and a surrounding region. When an object approaches the sensor electrode, the capacitance of the sensor electrode against ground or the capacitance of the capacitor formed by the two coupled sensor electrode regions changes. Such sensor electrodes are known, for example, from US 2016/0313587 A1, U.S. Pat. No. 6,654,070 B1, US 2010/179725 A1, WO 2015/086599 A1, WO 2016/116372 A1, U.S. Pat. No. 6,654,070 B1, and US 2006/275599 A1.

The capacitance change is measured by a circuit arrangement or an electronic sensor system; and when a threshold value is exceeded, a switching signal is triggered. Circuit arrangements for capacitive sensors are known, for example, from DE 20 2006 006 192 U1, EP 0 899 882 A1, U.S. Pat. No. 6,452,514 B1, and EP 1 515 211 A1.

The object of the present invention consists in providing an improved composite pane that has an extended capacitive switching region that can be simply and economically integrated into a composite pane. A touch sensor or proximity sensor can be formed in a simple manner with the extended capacitive switching region.

The object of the present invention is accomplished according to the invention by a pane arrangement comprising a composite pane having an extended capacitive switching region according to the independent claim 1. Preferred embodiments are apparent from the dependent claims.

The composite pane according to the invention having an extended capacitive switching region includes at least the following features:
  a first pane and a second pane that are joined to one another by at least one intermediate layer, preferably a thermoplastic intermediate layer, and are preferably joined areally to one another,
  an electro-optical functional element,
  a sensor electrode that is arranged between the first surface electrode and the first pane,
wherein the sensor electrode is capacitively coupled to the first surface electrode.

The pane arrangement according to the invention comprises
  a composite pane according to the invention and
  a capacitive electronic sensor system that is electrically connected to the sensor electrode, wherein the sensitivity of the electronic sensor system is selected such that when the outer surface of the first pane is touched above the first surface electrode by a human body part, such as a finger or a hand, or a human body part approaches the outer surface of the first pane above the first surface electrode, a switching signal is emitted.

The touch or approach need not take place over or in the vicinity of the sensor electrode; instead, a touch or approach to the outer surface of the first pane over the entire first surface electrode suffices.

The electro-optical functional element comprises at least:
  a first surface electrode,
  an electro-optical functional layer, and
  a second surface electrode,
wherein the electro-optical functional element is arranged, at least in sections, between the first pane and the second pane.

The electro-optical functional element is a planar functional element having electrically controllable optical properties. In other words, its optical properties and in particular its transparency, its scattering behavior, or its luminosity can be controlled by an electrical voltage signal. Electro-optical functional elements whose transparency can be controlled by an electrical voltage signal include as an electro-optical functional layer preferably one or a plurality of SPD films (SPD=suspended particle device), liquid-crystal-containing films, such as PDLC films (PDLC=polymer dispersed liquid crystal) or electrochromic layer systems. Electro-optical functional elements whose luminosity can be controlled by an electrical voltage signal include as an electro-optical functional layer preferably one or a plurality of OLED layer systems (OLED=organic light emitting diode) or display films, particularly preferably OLED display films, and most particularly preferably transparent OLED display films.

In an advantageous embodiment of the invention, the intermediate layer is a thermoplastic intermediate layer. In another advantageous embodiment of the invention, at least two, preferably exactly two, intermediate layers are arranged between the first pane and the second pane. A first intermediate layer is arranged between the first pane and the electro-optical functional element, and a second intermediate layer is arranged between the electro-optical functional element and the second pane.

The electro-optical functional element is arranged, at least in sections, between the first pane and the second pane. Here, "in sections" means that the electro-optical functional element does not have to cover the entire area of the first pane or the second pane, but, for example, only a subregion, such as a narrow band-shaped strip.

In the composite pane according to the invention, the electro-optical functional element is oriented such that its first surface electrode faces the first pane and its second surface electrode faces the second pane.

The sensor electrode is preferably arranged, in sections, between the first surface electrode and the first pane. Here, "in sections" means that the sensor electrode does not cover the entire area of the first pane or the second pane, but only a subregion, such as a circular area, a narrow band-shaped strip, a linear wire, or the like.

Here, the expression "arranged between the first surface electrode and the first pane" means that the sensor electrode is arranged in the region of the orthogonal projection of the first surface electrode between the first surface electrode and the first pane.

The sensor electrode according to the invention is capacitively coupled to the first surface electrode. In other words, the sensor electrode is galvanically isolated from the first surface electrode, at least in the region of the composite pane and upstream from an electronic sensor system or an electronic control system for the electro-optical functional element.

In a prior art composite pane, in which the sensor electrode is not capacitively coupled to the first surface electrode or in which, for example, no further electrically conductive regions are integrated into the composite pane, the spatial region, which results from the orthogonal projection of the sensor electrode onto the outer surface IV of the first pane 1, is only as large as the sensor electrode itself. The region is referred to in the following as "the capacitive switching region". When a human body part contacts or approaches the capacitive switching region, a switching signal can be measured by an electronic sensor system that is electrically conductingly connected to the sensor electrode.

As investigations of the inventors surprisingly revealed, the capacitive switching region can be extended by the capacitive coupling according to the invention of the sensor electrode to the first surface electrode. The extended capacitive switching region, in other words, the effective active region, in which a capacitive switching signal is measurable as a result of touching the outer surface IV of the first pane 1 or as a result of approaching it, is expanded to the area of the orthogonal projection of the first surface electrode on the outer surface IV. This increases the ease of use and makes switching by touching or approaching possible over a large region of the area of the composite pane. Furthermore, the necessity of marking or highlighting the region of the capacitive switching surface of a transparent sensor electrode is eliminated.

Sensor electrodes according to the invention can be designed in one or multiple parts and can, for example, consist of a first subregion of the sensor electrode and a second subregion. The second subregion is also referred to in the following as the "surrounding region" or "ground region".

In an advantageous embodiment of the invention, the sensor electrode is formed from a printed and fired electrically conductive paste, preferably a silver-containing screen printing paste. The printed and fired electrically conductive paste advantageously has a thickness of 3 µm to 20 µm and a sheet resistance of 0.001 ohm/square to 0.03 ohm/square, preferably of 0.002 ohm/square to 0.018 ohm/square. Such sensor electrodes are easy to integrate into the industrial manufacturing process and economical to produce.

In another advantageous embodiment of the invention, the sensor electrode is made of an electrically conductive foil, preferably a metal foil, and in particular a copper, silver, gold, or aluminum foil. The electrically conductive foil advantageously has a thickness of 50 µm to 1000 µm and preferably of 100 µm to 600 µm. The electrically conductive foil advantageously has conductivity of $1*10^6$ S/m to $10*10^7$ S/m and preferably of $3.5*10^7$ S/m to $6.5*10^7$ S/m.

Of course, such foils can also be arranged on carrier films, for example, polymeric carrier films, such as polyimide or polyethylene terephthalate (PET). Such sensor electrodes on carrier films are particularly advantageous, since even multipart sensor electrodes consisting, for example, of a first subregion of the sensor electrode and a surrounding region (ground region) can be produced from one unit and, during production, can be inserted conveniently and with precise positioning in the later vehicle antenna pane.

In another advantageous embodiment of the invention, the sensor electrode consists of at least one electrically conductive wire, preferably a metal wire, and in particular a tungsten, copper, silver, gold, or aluminum wire. Of course, such wires can also be arranged, for example, on the above-mentioned carrier films. The electrically conductive wire is preferably surrounded by electrical insulation, for example, by a plastic sheath. Particularly suitable wires have a thickness of 10 µm to 200 µm, preferably of 20 µm to 100 µm, and particularly preferably of 30 µm or 70 µm.

In another advantageous embodiment of the invention, the sensor electrode consists of an electrically conductive structure that is electrically isolated from the surrounding layer, out of an electrically conductive layer, by a coating-free separating region, in particular a coating-free separating line. In an advantageous embodiment, the width of the separating lines is from 30 µm to 200 µm and preferably from 70 µm to 140 µm. Such thin separating lines allow reliable and sufficiently high electrical insulation and, at the same time, interfere with vision through the composite pane only slightly or not at all.

The electrically conductive layer is preferably transparent. The electrically conductive layer can be arranged directly on the inside surface III of the first pane, on the first intermediate layer, or on an additional carrier film, preferably a transparent carrier film. Preferred are, for example, polymeric carrier films made, for example, of polyimide or polyethylene terephthalate (PET).

Electrically conductive layers according to the invention are known, for example, from DE 20 2008 017 611 U1, EP 0 847 965 B1, or WO2012/052315 A1. They typically include one or a plurality of, for example, two, three, or four, electrically conductive, functional layers. The functional layers preferably include at least one metal, for example, silver, gold, copper, nickel, and/or chromium, or a metal alloy. The functional layers particularly preferably include at least 90 wt.-% of the metal, in particular at least 99.9 wt.-% of the metal. The functional layers can be made of the metal or of the metal alloy. The functional layers particularly preferably include silver or a silver-containing alloy. Such functional layers have particularly advantageous electrical conductivity with simultaneous high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are achieved.

Typically, at least one dielectric layer is in each case arranged between two adjacent functional layers. Preferably, another dielectric layer is arranged below the first and/or above the last functional layer. A dielectric layer contains at least one individual layer made of a dielectric material, for example, containing a nitride such as silicon nitride or an oxide such as aluminum oxide. However, a dielectric layer can also include a plurality of individual layers, for example, individual layers of a dielectric material, smoothing layers, matching layers, blocking layers, and/or antireflection layers. The thickness of a dielectric layer is, for example, from 10 nm to 200 nm.

This layer structure is generally obtained by a sequence of deposition operations that are carried out by a vacuum method such as vacuum deposition or PVD (physical vapor deposition) methods such as magnetron-enhanced cathodic sputtering or CVD (chemical vapor deposition) methods.

Other suitable electrically conductive layers preferably contain or are made of indium tin oxide (ITO), fluorine-doped tin oxide ($SnO_2$:F), or aluminum-doped zinc oxide (ZnO:Al).

The electrically conductive layer can, in principle, be any coating that can be electrically contacted. If the composite pane according to the invention is intended to allow through-vision, as is the case, for example, with panes in the window sector, the electrically conductive layer is preferably transparent. In an advantageous embodiment, the electrically conductive layer is a layer or a layer structure of a plurality of individual layers having a total thickness less than or equal to 2 μm, particularly preferably less than or equal to 1 μm.

An advantageous transparent electrically conductive layer according to the invention has a sheet resistance of 0.4 ohm/square to 200 ohm/square. In a particularly preferred embodiment, the electrically conductive layer according to the invention has a sheet resistance of 0.5 ohm/square to 20 ohm/square.

The electrically conductive layer preferably includes a transparent, electrically conductive coating. Here, "transparent" means permeable to electromagnetic radiation of a wavelength of 300 nm to 1,300 nm and in particular to visible light.

In an advantageous embodiment of the pane according to the invention, the width $t_1$ of the separating lines with which the electrically conductive layer is electrically divided is from 30 μm to 200 μm and preferably from 70 μm to 140 μm. Such thin separating lines allow reliable and sufficiently high electrical insulation and, at the same time, interfere with vision through the composite pane only slightly or not at all.

If it is not necessary for the electrically conductive layer to be transparent, because the sensor electrode is arranged, for example, in a region of the composite pane, in which through-vision is prevented by a masking print or a plastic housing, the electrically conductive layer can also be significantly thicker than in the case of transparent electrically conductive layers. Such thicker layers can have a significantly low sheet resistance.

Of course, the sensor electrodes of the designs mentioned, such as printed paste, electrically conductive foil or wires, and separated electrically conductive layer, can be combined with one another. In other words, the first subregion can be made, for example, from an electrically conductive foil and the surrounding region from a printed paste, etc.

In an advantageous embodiment of the sensor electrode according to the invention, the sensor electrode or at least the first subregion of the sensor electrode has an area of 1 $cm^2$ to 200 $cm^2$, particularly preferably of 1 $cm^2$ to 9 $cm^2$. The length of the contact region is preferably from 1 cm to 14 cm and particularly preferably from 1 cm to 3 cm. The maximum width of the contact region is preferably from 1 cm to 14 cm and particularly preferably from 1 cm to 3 cm. The sensor electrode or at least the first subregion of the sensor electrode can, in principle, have any shape desired. Particularly suitable are circular, elliptical, or drop-shaped designs. Alternatively, angular shapes are possible, for example, triangles, squares, rectangles, trapezoids or other types of quadrilaterals, or higher order polygons. In general, it is particularly advantageous for any corners to be rounded. The sensor electrode can also include a linear element, for example, a wire that is designed with a spiral, comb, or grid shape, and whose outer dimension enlarges the capacitive coupling area of the sensor electrode.

In an advantageous embodiment, the sensor electrode is implemented in one piece. The sensor electrode is capacitively coupled to the first surface electrode, resulting in an extended capacitive region on the outer surface IV of the first pane. The one-piece sensor electrode can be connected to a capacitive electronic sensor system that is, for example, external (i.e., outside the composite pane). The capacitive electronic sensor system measures the capacitance of the sensor electrode and the first surface electrode coupled therewith. The capacitance of the sensor electrode and the first surface electrode coupled therewith changes against ground when a body (for example, a human body) comes into its vicinity or, for example, touches an insulator layer over the sensor electrode and the first surface electrode coupled therewith. The insulator layer includes, in particular, the material of the first pane itself. The capacitance change is measured by the electronic sensor system; and when a threshold value is exceeded, a switching signal is triggered. The extended capacitive switching region is defined by the shape and size of the first surface electrode.

In an alternative advantageous embodiment, the sensor electrode is implemented in multiple parts, preferably two parts. In other words, the sensor electrode has a first subregion and a surrounding region. Both the first subregion and the surrounding region can be connected to a capacitive electronic sensor system.

In such an arrangement, the first subregion and the surrounding region form two electrodes that are capacitively coupled to the first surface electrode and to one another. The capacitance of the capacitor formed by the electrodes changes upon approach of a body, for example, a human body part. The capacitance change is measured by an electronic sensor system; and when a threshold value is exceeded, a switching signal is triggered. The extended capacitive switching region, i.e., the sensitive region, is defined by the shape and size of the region of the first surface electrode, which is capacitively coupled with the system comprising the first subregion and the surrounding region.

The extended capacitive switching region according to the invention is integrated into the composite pane according to the invention. Thus, no switch or the like is necessary as a separate component that has to be attached to the composite pane. The composite pane preferably also has no other components that are arranged on its surfaces in the through-vision region. This is particularly advantageous in terms of a thin design of the composite pane and an only slight disruption of the vision through the composite pane.

An advantageous aspect of the invention comprises a pane arrangement having a composite pane according to the invention and an electronic sensor system that is electrically connected to the sensor electrode via a connection region. The electronic sensor system is a capacitive electronic sensor system.

In an advantageous embodiment of the switching arrangement according to the invention, the sensitivity of the electronic sensor system is selected such that when the contact region is touched by a human finger on the outer surface IV of the first pane in the extended capacitive switching region (i.e., in the region of the orthogonal projection of the first surface electrode onto the outer surface IV of the first pane), the electronic sensor system emits a switching signal; and when the contact region is touched on the outer surface I of the second pane, it emits no switching signal or a different switching signal. The asymmetry of the switching behavior is amplified by the second surface electrode, which can at least partially shield the capacitance change of the first surface electrode. Of course, the touching of the contact region can also be done with multiple fingers or another human body part. In the context of this invention, "touching" means any interaction with the switching region that results in a measurable change in the measurement signal, i.e., here, the capacitance. The sensitivity of the electronic sensor system can even be selected such that approaching the outer surface IV of the first pane in the extended capacitive switching region already suffices to trigger a switching event and direct touching is not necessary.

The switching signals emitted can be adapted as desired and to the requirements of the respective use. Thus, the switching signal can mean a positive voltage, for example, 12 V; no switching signal can mean, for example, 0 V; and a different switching signal can mean, for example, +6 V. The switching signals can also correspond to the voltages CAN_High and CAN_Low customary with a CAN bus and change by a voltage value between them. The switching signal can also be pulsed and/or digitally coded.

The sensitivity of the electronic sensor system can be determined, in the context of simple experiments, as a function of the size of the extended capacitive switching region and as a function of the thickness of the first pane, intermediate layer(s), and, optionally, the second pane.

The particular advantage of such a pane according to the invention resides in that the switching signal can be triggered only by touching the composite pane from one of the outside surfaces. In the case of a use of the pane arrangement in a motor vehicle window and installation of the composite pane with the first pane in the direction of the vehicle interior, it is possible, for example, to reliably avoid triggering the switching procedure by individuals from the outside or an unwanted triggering of the switching operation by rain or by movement of the windshield wiper, without fundamentally altering the pane construction generally used for laminated safety glass. This was unexpected and surprising for the person skilled in the art.

In an advantageous development of a pane arrangement according to the invention, the connection zone of the sensor electrode is connected to one or a plurality of flat conductors and the flat conductor is guided out of the pane. The integrated pane arrangement can then be connected in a particularly simple manner, at the place of use, to a voltage source and to a signal line, which evaluates the switching signal of the sensor circuit, for example, in a vehicle via a CAN bus.

In an advantageous development of a pane arrangement according to the invention, the electronic sensor system is connected to an electronic control system, wherein the electronic control system is connected to the electro-optical functional element and controls its optical properties. This permits particularly intuitive operation since the extended capacitive switching region is congruent with the component that is to be switched.

In principle, all electrically insulating substrates that are thermally and chemically stable as well as dimensionally stable under the conditions of production and use of the window pane or composite pane according to the invention are suitable as the first pane and the second pane.

The first pane and/or the second pane preferably contain glass, particularly preferably flat glass, most particularly preferably float glass, such as soda lime glass, borosilicate glass, or quartz glass, or clear plastics, preferably rigid clear plastics, in particular polyethylene, polypropylene, polycarbonate, polymethyl methacrylate, polystyrene, polyamide, polyesters, polyvinyl chloride, and/or mixtures thereof. The first pane and/or the second pane are preferably transparent, in particular for the use of the panes as a windshield or rear window of a vehicle or other uses where high light transmittance is desired. In the context of the invention, "transparent" refers to a pane that has transmittance greater than 70% in the visible spectral range. However, for panes that are not situated in the traffic-relevant field of vision of the driver, for example, for roof panels, the transmittance can also be much lower, for example, greater than 5%.

The thickness of the first pane and/or the second pane can vary widely and thus be ideally adapted to the requirements of the individual case. Preferably, standard thicknesses from 1.0 mm to 25 mm, preferably from 1.4 mm to 2.5 mm are used for vehicle glass and, preferably, from 4 mm to 25 mm for furniture, appliances, and buildings, in particular for electric heaters. The size of the panes can vary widely and is governed by the size of the use according to the invention. The first pane and the second pane have, for example, in motor vehicle engineering and the architectural sector, customary areas of 200 cm$^2$ up to 20 m$^2$.

The composite pane can have any three-dimensional shape desired. Preferably, the three-dimensional shape has no shadow zones such that it can, for example, be coated by cathodic sputtering. Preferably, the panes are planar or slightly or greatly curved in one or a plurality of spatial directions. In particular, planar substrates are used. The panes can be colorless or colored.

The first pane and the second pane are joined to one another by at least one intermediate layer, preferably by a first and a second intermediate layer. The intermediate layer is preferably transparent. The intermediate layer preferably contains at least one plastic, preferably polyvinyl butyral (PVB), ethylene vinyl acetate (EVA), and/or polyethylene terephthalate (PET). The intermediate layer can, however, also contain, for example, polyurethane (PU), polypropylene (PP), polyacrylate, polyethylene (PE), polycarbonate (PC), polymethyl methacrylate, polyvinyl chloride, polyacetate resin, casting resins, acrylates, fluorinated ethylene propylene, polyvinyl fluoride, and/or ethylene tetrafluoroethylene, or copolymers or mixtures thereof. The intermediate layer can be formed by one or even by a plurality of films arranged one over another, wherein the thickness of a film is preferably from 0.025 mm to 1 mm, typically 0.38 mm or 0.76 mm. The intermediate layers can preferably be thermoplastic, and, after lamination, bond the first pane, the second pane, and any other intermediate layers to one another. In a particularly advantageous embodiment of the composite pane according to the invention, the first intermediate layer is implemented as an adhesive layer made of an adhesive, with which the carrier film is adhesively bonded onto the first pane. In this case, the first intermediate layer preferably has the dimensions of the carrier film.

The terms "first pane" and "second pane" are selected to differentiate the two panes of a composite pane according to the invention. No statement about the geometric arrangement is associated with the terms. When the composite pane according to the invention is provided, for example, in an opening, for example, of a vehicle or a building, to separate the interior from the external environment, the first pane can face the interior or the external environment.

The first and the second surface electrode preferably contain a transparente, electrically conductive coating. Here, "transparent" means permeable to electromagnetic radiation, preferably electromagnetic radiation of a wavelength from 300 nm to 1.300 nm and in particular to visible light.

Surface electrodes according to the invention are known, for example, from DE 20 2008 017 611 U1, EP 0 847 965 B1, or WO2012/052315 A1. They typically contain one or a plurality, for example, two, three, or four electrically conductive, functional layers. The functional layers preferably contain at least one metal, for example, silver, gold, copper, nickel, and/or chromium, or a metal alloy. The functional layers particularly preferably contain at least 90 wt.-% of the metal, in particular at least 99.9 wt.-% of the metal. The functional layers can be made of the metal or of the metal alloy. The functional layers particularly preferably contain silver or a silver-containing alloy. Such functional layers have particularly advantageous electrical conductivity with simultaneous high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are obtained.

Typically, at least one dielectric layer is in each case arranged between two adjacent functional layers. Preferably, another dielectric layer is arranged below the first and/or above the last functional layer. A dielectric layer contains at least one individual layer made of a dielectric material, for example, containing a nitride such as silicon nitride or an oxide such as aluminum oxide. However, the dielectric layer can also include a plurality of individual layers, for example, individual layers of a dielectric material, smoothing layers, matching layers, blocking layers, and/or antireflection layers. The thickness of a dielectric layer is, for example, from 10 nm to 200 nm.

This layer structure is generally obtained by a sequence of deposition operations that are carried out by a vacuum method such as magnetron-enhanced cathodic sputtering.

Other suitable surface electrodes preferably contain indium tin oxide (ITO), fluorine-doped tin oxide ($SnO_2$:F), or aluminum-doped zinc oxide (ZnO:Al).

The surface electrode can, in principle, be any coating that can be electrically contacted. If the pane according to the invention is intended to allow through-vision, as is the case, for example, with panes in the window sector, the electrically conductive layer is preferably transparent. In an advantageous embodiment, the surface electrode is a layer or a layer structure of a plurality of individual layers having a total thickness less than or equal to 2 μm, particularly preferably less than or equal to 1 μm.

An advantageous surface electrode according to the invention has a sheet resistance of 0.4 ohm/square to 400 ohm/square. In a particularly preferred embodiment, the surface electrode according to the invention has a sheet resistance of 100 ohm/square to 400 ohm/square and in particular of 150 ohm/square to 400 ohm/square.

In an advantageous embodiment of a composite pane according to the invention, the electro-optical functional element is arranged away from the edge of the composite pane by a width of 2 mm to 50 mm, preferably of 5 mm to 20 mm. The electro-optical functional element then has no contact with the atmosphere and is advantageously protected by the intermediate layers in the interior of the composite pane against damage and corrosion.

The electrical supply line, which connects the surface electrodes and/or the sensor electrode to an external electronic control system or electronic sensor system, is preferably implemented as a foil conductor or flexible foil conductor (flat conductor, ribbon conductor). The term "foil conductor" means an electrical conductor whose width is significantly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating, preferably polymeric sheath, based, for example, on polyimide. Foil conductors that are suitable for contacting electrically conductive coatings in panes have a total thickness of, for example, only 0.3 mm. Such thin foil conductors can be embedded without difficulty in the thermoplastic intermediate layer between the individual panes. Multiple conductive layers electrically insulated from one another can be situated in a foil conductor strip.

Alternatively, thin metal wires can also be used as an electrical supply line. The metal wires contain in particular copper, tungsten, gold, silver, or aluminum or alloys of at least two of these metals. The alloys can also contain molybdenum, rhenium, osmium, iridium, palladium, or platinum.

The electrical line connection between the connection regions of an electrically conductive layer on a carrier film and the electrical supply line is preferably done via electrically conductive adhesives, which enable a reliable and durable electrical line connection between the connection region and the supply line. Alternatively, the electrical line connection can also be done by clamping since the lamination procedure reliably secures the clamp connection against slippage. Alternatively, the supply line can also be printed onto the connection region, for example, using a metal-containing and in particular a silver-containing, electrically conductive printing paste.

Another aspect of the invention comprises a method for producing a composite pane having a capacitive switching region, at least comprising:

(a) Applying an electrically conductive layer on a surface of a carrier film, (b) Introducing at least one separating line, which electrically divides the electrically conductive layer into at least one first subregion of a sensor electrode and at least one surrounding region, preferably by laser patterning or by mechanical or chemical removal, and (c) Producing a stack sequence comprising a first pane, a first intermediate layer, a second intermediate layer, and a second pane, wherein the carrier film is arranged, at least in sections, between the first pane and the first intermediate layer; and an electro-optical functional element is arranged between the first intermediate layer and the second intermediate layer, (d) Laminating the stack sequence to form a composite pane.

Applying the electrically conductive layer in step (a) can be done by methods known per se, preferably by magnetron-enhanced cathodic sputtering. This is particularly advantageous in terms of simple, quick, economical, and uniform coating of the substrate. However, the electrically conductive layer can also be applied, for example, by vapor deposition, chemical vapor deposition (CVD), plasma enhanced chemical vapor deposition (PECVD), or by wet chemical methods.

The carrier film can be subjected to a temperature treatment after step (a). The carrier film is heated along with the electrically conductive layer to a temperature of at least 200° C., preferably at least 300° C. The temperature treatment can serve to increase transmittance and/or to reduce the sheet resistance of the electrically conductive layer.

The de-coating of individual separating lines in the electrically conductive layer is preferably done by a laser beam. Methods for patterning thin metal films are known, for example, from EP 2 200 097 A1 or EP 2 139 049 A1. The width of the de-coating is preferably 10 μm to 1000 μm, particularly preferably 30 μm to 200 μm, and in particular 70 μm to 140 μm. In this range, a particularly clean and residue-free de-coating by the laser beam takes place. De-coating by laser beam is particularly advantageous since the de-coated lines are optically very inconspicuous and adversely impact the appearance and the transparency only a little. The de-coating of a line with a width that is wider than the width of one laser cut is done by repeatedly tracing the line with the laser beam. Consequently, the process duration and the process costs increase with an increasing line width. Alternatively, the de-coating can be done by mechanical ablation as well as by chemical or physical etching.

The first or the second intermediate layer can be formed in each case by a single film or even by two or more films that are arranged one over the other areally.

The bonding of the first and second pane in step (d) is preferably done under the action of heat, vacuum, and/or pressure. Methods known per se for producing a composite pane can be used.

For example, so-called autoclave methods can be carried out at an elevated pressure of approx. 10 bar to 15 bar and temperatures from 130° C. to 145° C. over approx. 2 hours. Vacuum bag or vacuum ring methods known per se operate, for example, at approx. 200 mbar and 80° C. to 110° C. The first pane, the thermoplastic intermediate layer, and the second pane can also be pressed in a calender between at least one pair of rollers to form a pane. Systems of this type are known for producing panes and normally have at least one heating tunnel upstream before a pressing facility. The temperature during the pressing operation is, for example, from 40° C. to 150° C. Combinations of calender and autoclave processes have particularly proved their worth in practice. Alternatively, vacuum laminators can be used. These consist of one or a plurality of heatable and evacuable chambers, in which the first pane and the second pane are laminated within, for example, approx. 60 minutes at reduced pressures of 0.01 mbar to 800 mbar and temperatures from 80° C. to 170° C.

Another aspect of the invention comprises the use of the composite pane according to the invention having an extended capacitive switching region in buildings, in particular in the access area, window area, roof area, or façade area, as a built-in component in furniture and appliances, in means of transportation for travel on land, in the air, or on water, in particular in trains, ships, and motor vehicles, for example, as a windshield, rear window, side window, and/or roof panel.

The invention further comprises the use of the extended capacitive switching region for the electrical control of a function inside or outside the composite pane, preferably a heating function, illumination, in particular a lighting means arranged in the composite pane, such as an LED, a change in the optical transparency of a functional intermediate layer, in particular a suspended particle device (SPD) layer or an electrochromic intermediate layer.

The invention includes, in particular, the use of the extended capacitive switching region for the electrical control of the function of the electro-optical functional element, allowing particularly intuitive operation.

In the following, the invention is explained in detail with reference to drawings and exemplary embodiments. The drawings are schematic representations and are not true to scale. The drawings in no way restrict the invention.

They depict:

FIG. 1A a plan view of an embodiment of a pane arrangement according to the invention having a composite pane according to the invention, FIG. 1B a cross-sectional view along the section line A-A' of FIG. 1A, FIG. 1C an enlarged view of the carrier film according to the invention of FIG. 1A, FIG. 2 a plan view of an alternative embodiment of a pane arrangement according to the invention having a composite pane according to the invention, FIG. 3A a plan view of another alternative embodiment of a pane arrangement according to the invention having a composite pane according to the invention, FIG. 3B an enlarged view of the detail Z of FIG. 3A, FIG. 3C a cross-sectional view along the section line B-B' of FIG. 3B, and FIG. 4 a detailed flowchart of an embodiment of the method according to the invention.

FIG. 1A depicts a plan view of an exemplary embodiment of a pane arrangement 101 according to the invention having a composite pane 100 according to the invention using the example of an architectural glazing. The composite pane 100 can be part of an insulating glazing unit and can serve, for example, as an outer pane in a window of a building. Alternatively, the composite pane 100 can be arranged in an interior and be, for example, a glazing of a conference room.

FIG. 1B shows a cross-sectional view along the section line A-A' of FIG. 1A. Here, the composite pane 100 comprises, for example, a first pane 1 and a second pane 2 that are joined to one another via a first intermediate layer 3.1 and a second intermediate layer 3.2.

The dimensions of the composite pane 100 are, for example, 1.4 m×1.5 m. The first pane 1 is, for example, intended, in the installed position, to face an interior. In other words, the outer surface IV of the first pane 1 is accessible from the interior, whereas, in contrast, the outer surface I of the second pane 2 faces outward relative to the interior. The first pane 1 and the second pane 2 are made, for example, of soda lime glass. The thickness of the first pane 1 is, for example, 3 mm and the thickness of the second pane 2 is, for example, 4 mm. Of course, the first pane 1 and the second pane 2 can have any thicknesses desired and can, for example, also have the same thickness. The intermediate layers 3.1,3.2 are thermoplastic intermediate layers and are made, for example, of ethylene vinyl acetate (EVA). They have in each case a thickness of 0.7 mm. A carrier film 30 with a sensor electrode 8 is arranged in the central, left, upper section of the composite pane 100 between the first intermediate layer 3.1 and the second intermediate layer 3.2.

A planar electro-optical functional element 4 is arranged between the first intermediate layer 3.1 and the second intermediate layer 3.2. The functional element 4 extends, for example, completely over the area of the composite pane 100 minus a narrow edge region, which serves for the electrical insulation of the functional element 4 and for the protection of the components of the functional element 4 against, for example, moisture and oxidation. The edge region is sealed by an adhesive bonding of the first intermediate layer 3.1 and the second intermediate layer 3.2.

The electro-optical functional element 4 comprises a first surface electrode 5, an electro-optical layer 6, and a second surface electrode 7 that are arranged areally atop one another, in other words, which are stacked atop one another via their surfaces. The first surface electrode 5 is arranged directly adjacent the first intermediate layer 3.1 directly and thus faces the first pane 1. The second surface electrode 7 is arranged directly adjacent the second intermediate layer 3.2 and thus faces the first pane 1. The electro-optical layer 6 is, for example, an SPD (suspended particle device) layer system that is electrically contacted by the first surface electrode 5 and the second surface electrode 7. For this, the surface electrodes 5,7 have a sheet resistance of 150 ohm/square to 400 ohm/square and, for example, of 250 ohm/square.

The transparency of the electro-optical layer 6 can be controlled by a voltage signal that is applied on the surface electrodes 5,7. For this, the surface electrodes 5,7 are electrically connected to an electronic control system 21, for example, via two foil conductors made in each case of a 50-μm-thick copper foil.

FIG. 1C depicts an enlarged cross-sectional view of the carrier film 30 according to the invention of FIG. 1B. The carrier film 30 is, in this example, a transparent polyethylene terephthalate (PET) film with a thickness of, for example, 0.05 mm. A transparent, electrically conductive layer 31 is arranged on the carrier film 30. The electrically conductive layer 31 is a layer system that includes, for example, three electrically conductive silver layers that are separated from one another by dielectric layers.

The electrically conductive layer 31 extends, for example, over one entire side of the carrier film 30. In the exemplary embodiment depicted, the electrically conductive layer 31 is arranged on that side of the carrier film 30 that faces the first pane 1. The carrier film 30 set back from the pane edge into the pane interior by a distance of approx. 8 mm. This region is hermetically sealed by adhesive bonding of the two intermediate layers 2,3 during lamination such that the electrically conductive layer 6 is protected against moisture from the surroundings of the composite pane 100 and thus against corrosion and damage. Alternatively, it would be possible to leave the carrier film 30 coating free in an edge region or to remove the electrically conductive layer 6 there.

The electrically conductive layer 31 is divided by coating-free separating lines 32 into different regions that are electrically isolated from one another: a first subregion 8.1 and a second subregion that is referred to in the following as surrounding region 8.2.

The separating line 32 has a width $t_1$ of, for example, only 100 μm and is introduced, for example, by laser patterning into the electrically conductive layer 31. Separating lines 32 of such low width are hardly perceptible visually and disrupt vision through the composite pane 100 only slightly, this being particularly aesthetic.

The first subregion 8.1 and the surrounding region 8.2 form together a capacitive sensor electrode 8, wherein the capacitance measurement is measured differentially between the first subregion 8.1 and the surrounding region 8.2. The first subregion 8.1 is substantially circular and the surrounding region 8.2 surrounds the subregion 8.1 almost completely. The circular first subregion 8.1 has, for example, a diameter of 40 mm. The subregion 8.1 and the surrounding region 8.2 are guided over the electrically conductive layer 31 on the carrier film 30 into the edge region of the composite pane 100 and connected there to a capacitive electronic sensor system 20 via an external supply line.

A reliable electrically conducting connection between an external supply line and the sensor electrode 8 is achieved, for example, by means of an electrically conductive adhesive. The external supply line consists, for example, of a 50-μm-thick copper foil and is, for example, insulated outside the immediate connection region with a polyimide layer. As a result, one of the foil conductors can be guided out, without an electrical short-circuit, for example, beyond the surrounding region 8.2 over the lower edge of the composite pane 100. Of course, the electrical line connection of the connection region to the outside can also be guided to the outside via insulated wires or via a region in which the electrically conductive layer of the surrounding region is discontinuous.

The subregion 8.1 and the surrounding region 8.2 are connected to a capacitive electronic sensor system 20. The electronic sensor system 20 suitable for precisely measuring capacitance changes of the sensor electrode 8; in other words, of the first subregion 8.1 relative to the surrounding region 8.2, and emitting a switching signal as a function of a threshold value. The electronic sensor system 20 is, for example, connected to the electronic control system 21 of the electro-optical functional element 4. The transparency of the electro-optical functional element 4, for example, and, thus, of the composite pane 100 can be controlled via the switching signal.

The sensor electrode 8 and in particular the first subregion 8.1 are, in this example, arranged completely overlapping with the electro-optical functional element 4. In other words, the sensor electrode 8 is arranged in the region of the orthogonal projection relative to the electro-optical functional element 4.

As a result of the small distance between the electrically conductive layer 21 of the sensor electrode 8 and of the first surface electrode 5, the sensor electrode 8 and the first surface electrode 5 are capacitively coupled to one another. As a result of the small distance that consists only of the layer thickness of the carrier film 30 and the layer thickness of the first intermediate layer 3.1, the capacitive coupling is great enough that when the outer surface IV of the first pane 1 is touched, a capacitance change can be measured via the sensor electrode 8 and the electronic sensor system 20. This occurs even when the outer surface IV of the first pane 1 is not touched directly above the sensor electrode 8, but, instead, in the complete region above the first surface electrode 5. This was unexpected and surprising for the person skilled in the art.

In the exemplary embodiment shown, the structure and the tuning of the electronic sensor system 20 are coordinated such that when the outer surface IV of the first pane 1 is touched above the first surface electrode 5 and thus above the area of the electro-optical functional element 4, a switching signal is triggered.

The electronic sensor system 20 can be tuned such that when the outer surface I of the second pane 2 is touched above the electro-optical functional element 4, no switching signal is triggered. The electro-optical layer 6 and the second surface electrode 7 shield the first surface electrode 5 and thus increase the asymmetry of the sensitivity.

FIG. 2 depicts a plan view of an exemplary embodiment of an alternative pane arrangement 101 according to the invention having a composite pane 100 according to the invention using the example of a vehicle pane and, in particular, the windshield of a passenger car. The pane arrangement 101 and the composite pane 100 of FIG. 2 correspond largely to the pane arrangement 101 and the composite pane 100 of FIG. 1A-C such that only the differences are discussed here.

The dimensions of the composite pane 100 are, for example, 0.9 m×1.5 m. The first pane 1 is, for example, intended to face the interior of a vehicle in the installed position. In other words, the outer surface IV of the first pane 1 is accessible from the interior, whereas, in contrast, the outer surface I of the second pane 2 faces outward relative to the vehicle interior. The first pane 1 and the second pane 2 are made, for example, of soda lime glass. The thickness the first pane 1 is, for example, 1.6 mm; and the thickness of the second pane 2 is, for example, 2.1 mm. Of course, the first pane 1 and the second pane 2 can have any thicknesses desired and, for example, can even have the same thickness.

In the example shown, a planar electro-optical functional element 4 is arranged in the upper region of the composite pane 100. The functional element 4 extends, for example, completely over the width of the composite pane 100 minus a narrow edge region. The functional element 4 extends only over a strip of, for example, 20 cm in the upper region of the composite pane 100 and serves there as a sun visor. The electro-optical functional element 4 is, for example, an SPD functional element, as is described in FIG. 1A-C, and includes a first surface electrode 5, an electro-optical layer 6 of, for example, an SPD (suspended particle device) layer system, and a second surface electrode 7.

The electro-optical functional element 4 is arranged, as shown in FIG. 1B, between a first intermediate layer 3.1 and a second intermediate layer 3.2. In contrast to the intermediate layers 3.1,3.2 of FIG. 1B, the intermediate layers 3.1,3.2 in this example are made of polyvinyl butyral (PVB) and have in each case a thickness of 0.38 mm.

A sensor electrode 8 is arranged in the upper left region of the composite pane 100. The sensor electrode 8 corresponds, for example, to the sensor electrode 8, as it is shown in FIG. 1A-1C. Here, as well, the first subregion 8.1 and the surrounding region 8.2 are formed from a transparent, electrically conductive layer 31 divided by separating lines 32 that are arranged on a carrier film 30. In this example, as well, the capacitive electronic sensor system 20 is connected to the electronic control system 21 of the electro-optical functional element 4. The sensor electrode 8 is also capacitively coupled to the first surface electrode 5 such that the capacitive switching region 10, in which a switching signal can be triggered when the outer surface IV of the first pane 1 is touched or approached, is extended to the region above the first surface electrode 5. In other words, for triggering a switching signal, the region directly above the sensor electrode 8 does not have to be touched; instead, touching the region above the first surface electrode 5 suffices. This allows particularly intuitive operation of the shading function of the sun visor, since a specific location such as a switch or a small switching surface does not have to be touched; instead, it suffices to touch any region of the composite pane 100 above the sun visor in order to bring about a change in transparency. A separate marking of a switching region on the composite pane can be avoided, which is technically simple, more economical, and aesthetically more appealing.

FIG. 3A depicts a plan view of another alternative exemplary embodiment of a pane arrangement 101 according to the invention having a composite pane 100 according to the invention. The pane arrangement 101 and the composite pane 100 correspond largely to the pane arrangement 101 and composite pane 100 of FIG. 2 such that only the differences are discussed here.

In contrast to FIG. 1A-C and FIG. 2, here, the sensor electrode 8 is made of a metal wire 40 and, for example, of copper wire with a thickness of, for example, 200 µm. The metal wire 40 is insulated by a plastic layer (insulation 41). As FIG. 3C shows, the metal wire 40 can be arranged directly adjacent the first surface electrode 5, since a galvanic connection is prevented by the insulation 41 and a capacitive coupling is ensured.

FIG. 3B depicts an enlarged view of the region Z of FIG. 3A. The metal wire is, for example, arranged in the shape of a spiral, enlarging the effective capacitive area of the sensor electrode 8. Optionally shown here is a ground wire 42, which allows a differential capacitance measurement. It should particularly be emphasized that even a metal wire 40 without ground wire 42 presents the effect according to the invention, namely, the extension of the capacitive switching region of the sensor electrode 8 to the entire region above the first surface electrode 5 and, thus, above the entire region of the electro-optical functional element 4.

In another example (not shown here), the composite pane is implemented as a roof panel in a vehicle. There, the electro-optical functional element is extended over the entire roof panel, minus an edge region, which serves for electrical insulation and protection against corrosion. As a result of the extension of the capacitive switching region according to the invention, any vehicle occupant can execute a switching event by touching the outer surface IV of the first pane (i.e., the pane facing the interior) and control, for example, the transparency of the electro-optical functional element. This is technically particularly simple and very convenient for all vehicle occupants. If the electro-optical functional element includes, for example, an OLED layer as an electro-optical functional layer, with suitable wiring, each vehicle occupant can bring about illumination of the interior.

FIG. 4 depicts a flowchart of an exemplary embodiment of the method according to the invention for producing a composite pane 100 having an extended capacitive switching region 10 comprising the following steps S1-S4.

S1: Applying an electrically conductive layer 31 on a surface of a carrier film 30;

S2: Introducing at least one separating line 32, which electrically divides the layer 31 into at least one first subregion 8.1 of a sensor electrode 8 and at least one surrounding region 8.2, preferably by laser patterning or by mechanical or chemical removal;

S3: Producing a stack sequence comprising a first pane 1, a first intermediate layer 3.1, a second intermediate layer 3.2, and a second pane 2, wherein the carrier film 30 is arranged, at least in sections, between the first pane 1 and the first intermediate layer 3.1; and an electro-optical functional element 4 at least comprising a first surface electrode 5 is arranged between the first intermediate layer 3.1 and the second intermediate layer 3.2, wherein the sensor electrode 8 is arranged, at least in sections, in the region of the orthogonal projection of the first surface electrode 5; and S4: Laminating the stack sequence to form a composite pane 100.

LIST OF REFERENCE CHARACTERS

1 first pane
2 second pane
3 intermediate layer
3.1 first intermediate layer
3.2 second intermediate layer
4 electro-optical functional element
5 first surface electrode
6 electro-optical layer
7 second surface electrode
8 sensor electrode
8.1 first subregion of the sensor electrode 8
8.2 surrounding region
10 extended capacitive switching region
20 capacitive electronic sensor system
21 electronic control system for the electro-optical functional element 4
30 carrier film
31 electrically conductive layer
32 separating line
40 metal wire
41 insulation of the metal wire 40
42 ground wire
100 composite pane
101 pane arrangement
A-A' section line
B-B' section line
S1,S2,S3,S4 steps
I outer surface of the second pane 2

II inner surface of the second pane 2
III inner surface of the first pane 1
IV outer surface of the first pane 1

The invention claimed is:

1. A pane arrangement comprising:
a first pane and a second pane that are joined to one another by at least one intermediate layer,
an electro-optical functional element, comprising a first surface electrode, an electro-optical functional layer, and a second surface electrode, wherein the electro-optical functional element is arranged between the first pane and the second pane, with the first surface electrode facing the first pane, and the second surface electrode facing the second pane,
a sensor electrode that is arranged between the first surface electrode and the first pane, with the sensor electrode being capacitively coupled to the first surface electrode,
a capacitive electronic sensor system that is electrically connected to the sensor electrode, wherein a sensitivity of the electronic sensor system is selected such that a capacitive switching region for emitting a switching signal is expanded to an area of an orthogonal projection of the first surface electrode on an outer surface of the first pane, and such that when the outer surface of the first pane is touched directly above the sensor electrode or in a complete region above the first surface electrode by a human body part or said human body part approaches the outer surface of the first pane directly above the sensor electrode or in the complete region above the first surface electrode, the switching signal is emitted.

2. The pane arrangement according to claim 1, wherein the electro-optical functional element is a planar functional element, whose optical properties are controllable by an electrical voltage signal.

3. The pane arrangement according to claim 1, wherein the sensor electrode includes or is made of
a printed and fired electrically conductive paste and/or
an electrically conductive foil and/or
an electrically conductive wire and/or
an electrically conductive layer.

4. The pane arrangement according to claim 3, wherein the sensor electrode consists of an electrically conductive layer, wherein an electrically conductive first subregion is electrically isolated by a coating-free subregion from an electrically conductive surrounding region, and wherein the first subregion and the surrounding region can be electrically connected to an electronic sensor system.

5. The pane arrangement according to claim 4, wherein a width $t_1$ of the separating line is from 30 μm to 200 μm.

6. The pane arrangement according to claim 1, wherein an area of the orthogonal projection of the sensor region on the first surface electrode is from 1 cm² to 200 cm².

7. The pane arrangement according to claim 1, wherein the sensor electrode has a rectangular, square, trapezoidal, triangular, circular, elliptical, or drop-shaped shape or rounded corners.

8. The pane arrangement according to claim 3, wherein the carrier film is transparent.

9. The pane arrangement according to claim 1, wherein the first pane and/or the second pane contains or is made of glass, or polymers or mixtures thereof.

10. The pane arrangement according to claim 1, wherein the electrically conductive layer and/or the first surface electrode
is transparent and/or
has a sheet resistance of 0.4 ohm/square to 400 ohm/square and/or
contains or is made of silver, indium tin oxide, fluorine-doped tin oxide, or aluminum-doped zinc oxide.

11. The pane arrangement according to claim 1, wherein the sensor electrode is arranged in a region of the orthogonal projection of the first surface electrode.

12. The pane arrangement according to claim 1, wherein the sensitivity of the electronic sensor system is selected such that the switching signal, even with touching or approaching, emits no switching signal or a different switching signal.

13. The pane arrangement according to claim 2, wherein the electro-optical functional layer is an SPD film (SPD=suspended particle device) or a liquid-crystal-containing film, an electrochromic layer system, or an OLED layer system (organic light emitting diode), or a display film.

14. The pane arrangement according to claim 3, wherein
the printed and fired electrically conductive paste is a silver-containing screen printing paste,
the electrically conductive foil is a copper, silver, gold, or aluminum foil,
the electrically conductive wire is a tungsten, copper, silver, gold, or aluminum wire with electrical insulation,
the electrically conductive layer is arranged directly on the inner surface of the first pane or on a carrier film.

15. The pane arrangement according to claim 4, wherein the electrically conductive first subregion is electrically isolated by a coating-free separating line.

16. The pane arrangement according to claim 7, wherein the first subregion of the sensor electrode has a rectangular, square, trapezoidal, triangular, circular, elliptical, or drop-shaped shape or rounded corners.

17. The pane arrangement according to claim 12, wherein the sensitivity of the electronic sensor system is selected such that the switching signal, even with touching of the outer surface of the second pane above the first surface electrode, emits no switching signal or a different switching signal.

18. A method for producing a pane arrangement according to claim 1, comprising:
applying an electrically conductive layer on a surface of a carrier film,
introducing at least one separating line, which electrically divides the electrically conductive layer into at least one first subregion of a sensor electrode and at least one surrounding region,
producing a stack sequence comprising a first pane, a first intermediate layer, a second intermediate layer, and a second pane, wherein
the carrier film is arranged, at least in sections, between the first pane and the first intermediate layer,
an electro-optical functional element at least comprising a first surface electrode is arranged between the first intermediate layer and the second intermediate layer, and
the sensor electrode is arranged at least in sections in the region of the orthogonal projection of the first surface electrode, and
laminating the stack sequence,
wherein a sensitivity of an electronic sensor system of the pane arrangement is selected such that a capacitive switching region for emitting a switching signal is expanded to an area of an orthogonal projection of the first surface electrode on an outer surface of the first pane, and such that when the outer surface of the first pane is touched directly above the sensor electrode or in a complete region above the first surface electrode by a human body part or said human body part approaches the outer surface of the first pane directly above the sensor electrode or in the complete region above the first surface electrode, the switching signal is emitted.

19. A method comprising utilizing a pane arrangement according to claim 1 in means of transportation for travel on land, in the air, or on water, as a windshield, rear window, side windows, and/or roof panel as well as a functional individual piece, and as a built-in component in furniture, appliances, and buildings, or as building glazing in the construction sector or the architectural sector indoors or outdoors.

20. A method comprising utilizing a capacitive switching region according to claim 1 for the electrical control of a function inside or outside the pane arrangement.

* * * * *